United States Patent [19]
Hawkins

[11] Patent Number: 5,106,293
[45] Date of Patent: Apr. 21, 1992

[54] SYSTEM FOR DETECTING THE CONDITION OF IGNITION ASSEMBLIES

[76] Inventor: Arnold Hawkins, 1487 - 6th Ave., San Francisco, Calif. 94122

[21] Appl. No.: 108,134

[22] Filed: Oct. 13, 1987

[51] Int. Cl.⁵ .............................................. G01R 31/00
[52] U.S. Cl. ............................................ 431/2; 431/13; 324/393; 324/399; 324/402
[58] Field of Search ................. 431/13, 2; 324/379, 324/393, 399, 402, 536, 95, 102, 555, 556, 520; 340/600; 343/700

[56] References Cited

U.S. PATENT DOCUMENTS

| | | |
|---|---|---|
| 2,471,968 | 6/1945 | McCullough . |
| 2,645,751 | 7/1949 | Byerlay . |
| 2,969,500 | 8/1957 | Andert . |
| 3,028,543 | 4/1962 | Parmater et al. ............... 324/399 X |
| 3,238,447 | 8/1966 | Bychinsky . |
| 3,586,468 | 6/1971 | Sims ..................... 431/2 X |
| 3,603,872 | 9/1971 | Peita . |
| 3,793,582 | 2/1974 | Maria et al. . |
| 3,793,583 | 2/1974 | Glomski et al. ............... 324/379 X |
| 3,820,018 | 6/1974 | Beasley et al. ............... 324/520 X |
| 3,942,113 | 3/1976 | Wilson ............................ 324/402 X |
| 3,959,725 | 5/1976 | Capek ............................ 324/402 X |
| 4,072,899 | 2/1978 | Shimp ............................ 324/520 X |
| 4,090,125 | 5/1978 | Warner . |
| 4,434,402 | 2/1984 | Lane . |
| 4,439,723 | 3/1984 | Loftness ......................... 324/536 X |
| 4,558,280 | 12/1985 | Koehl et al. . |
| 4,608,536 | 8/1986 | Jacobs et al. . |
| 4,731,586 | 3/1988 | Perkins ........................... 324/536 |

FOREIGN PATENT DOCUMENTS 666973 2/1952 United Kingdom ................ 324/379

OTHER PUBLICATIONS

Micronata's Owner's Manual for LCD Digital Autoranging Pocket Multimeter, Catalog No. 22-170, Radio Shack.
Micronata's Precision Panel Meter, 0 to 15 Volts DC, Radio Shack Catalog, No. 270-1754.
*Landmesser Tools Co. Advertising Supplement*, p. 38, Milton Electronic Ignition Tester.
*Johnstone Supply Advertising Supplement*, vol. No. 12, Dec. 1987, p. 8, AC Voltage Detector, No. H24–069.
Honeywell's Gas Pilot and Flame Rod Assemblies, No. C7005A, B, Rev. Dec. 1977.
*James Kamm Tech Catalog*, p. 646, "Katy Spark Ignition Controls Tester".

Primary Examiner—Carl D. Price

[57] ABSTRACT

A detector for detecting the condition of an ignition assembly in a burner is disclosed. The flame in the burner is ignited in a fuel medium by means of an electric arc across a spark gap in the ignition assembly. The assembly is substantially inaccessible for the purpose of testing through direct electrical contact without disassembling the burner. A detector detects the radio frequency emission of the arc at a distance from the burner and the control system for the burner. The output of the detector is rectified and displayed to provide a visual indication of the condition of the assembly.

8 Claims, 2 Drawing Sheets

BLOCK DIAGRAM IS FOR A
SANYO AM RADIO

SYSTEM FOR DETECTING THE CONDITION OF IGNITION ASSEMBLIES

BACKGROUND OF THE INVENTION

This invention relates in general to detection devices and in more particular to a system for detecting the condition of spark gap ignition assemblies.

Industrial and commercial oil burners and gas burners typically employ a fuel pilot assembly, where the fuel is usually gas or oil. The fuel pilot is ignited by means of an arc generated by a high voltage across an ignition spark gap in a spark gap ignition assembly. The arc ignites a fuel mixture supplied to the vicinity of the gap, thus starting the fuel pilot.

The conditions of the spark gap ignition assembly may change due to continuous use. Thus a carbon hair (frequently caused by too much fuel in the fuel-air mixture) may build up bridging the spark gap, thereby shorting out the gap. Malfunctions may cause the pressure of the air and fuel mixture to be too high or too low, thereby affecting the stability of the arc for the fuel pilot to be started properly. Wear and tear on the spark gap assembly may also affect the proper lighting of the fuel pilot. Thus the transformer may supply no or too low a voltage for starting an arc. The wires connecting the transformer to the spark gap may become worn and shorted out so that no or too low a voltage appears across the gap and no arc can be started.

The spark gap ignition assembly is usually located deep inside the industrial or commercial burner. While the above described malfunctions can be discovered by disassembling the spark gap assembly, such procedure is tedious and time consuming and would require lengthy shutdown of the burner. It is therefore desirable to provide an instrument by which the above described malfunctions can be detected without disassembling the spark gap assembly and without shutting down the burner.

Control systems for industrial or commercial burners have been increasingly automated. Frequently the burners are controlled by an elaborate control system, complete with sophisticated detection equipment and computer control system which monitor every facet of the burners, except for directly monitoring the spark gap ignition assembly. The control system for industrial or commercial burners usually includes an infrared (IR) or ultraviolet (UV) detector or both for sensing whether the fuel pilot flame is on. When the detectors detect the presence of the pilot flame, the control system then causes the main fuel valve to be turned on for lighting the main burner.

One of the most frequent causes of burner malfunction is a defective spark gap ignition assembly. Most control systems for burners, however, do not include any dedicated device for testing the condition of the spark gap ignition assembly apart from the IR or UV detectors. The failure of the fuel pilot flame to be lit can be caused by a number of factors, including a defective fuel valve, malfunctions of the control system or a defective spark gap ignition assembly. The IR or UV detector, however, detects only whether the fuel pilot is on but cannot identify the cause of the failure. Thus if the fuel pilot flame fails to light, a user would frequently diagnose and correct the problem by trial and error. Thus one frequent cause of the failure is the build up of a carbon hair bridging the spark gap. A user may simply change the control system at a cost of about $500 to $2500. Air blowing across the spark gap during a prepurge or post-purge cycle, the vibration of the burner and/or the change of the control system may cause the carbon hair to fall off. Hence while changing the control system may have temporarily solved the problem, the carbon will build up again causing another failure of the fuel pilot. Thus without a separate device for detecting the condition of the spark gap ignition assembly as proposed by applicant herein, the process of identifying the cause of pilot flame failure can tax the patience of a user.

A conventional instrument used in conjunction with control systems for burners is the Katy Spark Ignition Controls Tester, available from James Kamm Tech, P.O. Box 47673, Toledo, Ohio 43624. The Katy Spark Ignition Controls Tester is essentially a meter having AC and DC volt ranges with electrical leads. The leads are connected to external test jacks in the control system to receive signals originating from the IR or UV detectors to indicate the presence or absence of the fuel pilot flame. Thus while the Katy Tester does give the user an indication of whether the fuel pilot flame is lit or not which many control systems do not. However, the Katy Tester still cannot identify whether the failure of the fuel pilot is caused by a defective fuel valve, a defective spark gap ignition or still other causes.

None of the above described systems is satisfactory. It is therefore desirable to provide an improved system for testing the various malfunctions of the ignition assembly, without shutting down the burner and without retrieving or disassembling the spark gap ignition assembly.

SUMMARY OF THE INVENTION

The system of this invention is for detecting condition of an ignition assembly in a burner in which a flame is ignited in a fuel medium by means of an electric arc across a spark gap in the assembly where the assembly is substantially inaccessible for the purpose of testing through direct electrical contact without disassembling the burner. The burner has a control system for controlling and operating the burner. The apparatus of this invention comprises means for detecting the radio frequency emission of the arc at a location separate from that of the burner and the control system. The detecting means generates an output signal indicative of the strength of the emission. The apparatus further comprises means for rectifying the output signal and meter means responsive to the rectified output signal for displaying the strength of the emission in order to provide visual indication of the condition of the assembly. In such manner the condition of the assembly can be observed at a distance from the burner and control system and without disassembling the burner.

DETAILED DESCRIPTION OF THE INVENTION

Figure 1:
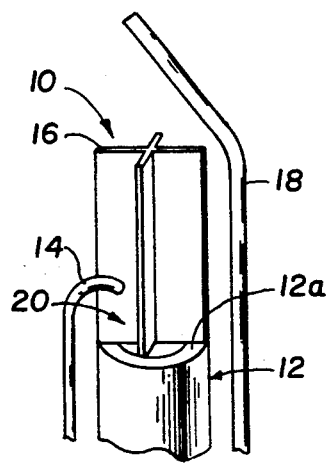
FIG. 1 is a simplified perspective view of a portion of a fuel pilot and flame rod assembly to illustrate the invention.

FIG. 1 is a simplified perspective view of a portion of a fuel pilot and flame rod assembly 10 to illustrate the invention. Assembly 10 includes a flame retention nozzle 12, an ignition electrode 14, flame ground 16 and a flame rod 18. To the bottom end of nozzle 12 is supplied a fuel mixture such as a combustible gas and air. A high voltage is applied between electrode 14 and nozzle 12 thereby generating an arc across the spark gap 20. The gas mixture supplied to the bottom end of nozzle and escaping from the top end 12a of nozzle 12 is ignited by the arc into a pilot flame which envelopes the flame ground 16. If the pilot flame is lit, the pilot flame causes a current to flow from the flame rod 18 to the control system of the burner (not shown); the current is detected by the control system to indicate the presence or absence of the pilot flame.

A number of conditions can prevent an arc from forming across gap 20 to ignite the fuel pilot. Thus if too rich a fuel mixture has been used for a period of time, carbon deposits in the form of a carbon hair may bridge the gap 20 so that no arc will form across the gap. Certain wires may become shorted out or disconnected because of wear and tear causing no voltage or too low a voltage to be applied across gap 20. When the transformer used to generate the high voltage to be applied across the spark gap becomes defective, no voltage or too low a voltage is applied across the gap. The spark gap 20 should be of sufficient width for a strong and stable arc to form across the gap. Thus, carbon deposits or mechanical vibrations and movements may cause the gap to become narrower than the desired width. When this happens, the arc generated may be too weak for properly igniting the fuel pilot.

Other conditions may also prevent the pilot flame to be properly ignited. Thus, if the pressure of the gas mixture applied to nozzle 12 is too high, it causes the arc across gap 20 to vibrate. When this happens the arc may not be able to ignite the pilot flame.

This invention is based on the recognition that all the conditions above can be detected by detecting the radio frequency emission of the arc. This eliminates the need for direct electrical contacts with parts of the spark gap ignition assembly, so that the conditions of the assembly can be detected without disassembling the assembly or the burner. Thus, if there is no voltage or too low a voltage applied across the gap so that there is no arc, no radio frequency emission of the arc will be detected. If the gap is narrower than that desirable so that the arc is not sufficient for igniting the gas, the magnitude of the radio frequency emission from the arc will also be of low magnitude. On the other hand, if the pressure of the gas applied to nozzle 12 is too high causing the arc to vibrate, the magnitude of the radio frequency emission of the arc will be much stronger than that of the emission from a normal arc. Therefore, by detecting the magnitude of the radio frequency emission of the arc and comparing the magnitude detected to the normal magnitude of the arc for proper ignition, the above described defects of the spark gap ignition assembly can be detected.

Figure 2:
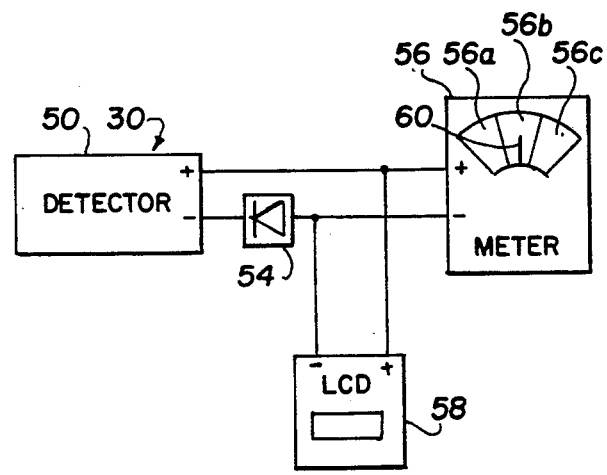
FIG. 2 is a block diagram of a detection system for detecting the condition of the spark gap ignition assembly in the fuel pilot and flame rod assembly of FIG. 1 to illustrate the preferred embodiment of the invention.

FIG. 2 is a block diagram of a detection system 30 for detecting the condition of the spark gap ignition assembly 10 of FIG. 1 to illustrate the preferred embodiment of the invention. As shown in FIG. 2, detector 50 is placed at a location separate from that of assembly 10 to detect its radio frequency emission. Detector 50 generates an output signal indicative of the magnitude of the radio frequency emission of the arc. Such output signal is rectified by rectifier 54 (which may simply be a diode) so that the rectified output signal is suitable for display by a meter. The rectified output signal of detector 50 is then applied to an analog meter 56. The rectified output signal may also be applied to a digital meter 58 instead of or in addition to analog meter 56. Both meters are for displaying the magnitude of the radio frequency emission of the arc.

Meters 56, 58 need to be calibrated before they can be used to detect the condition of the spark gap ignition assembly. When it is known that the assembly is in proper working order, such as when the assembly is first tested and installed, detector 50 is placed at a location separate from the burner and selected for convenient testing. The location may be up to 10 or 15 feet from the spark gap ignition assembly. The scale of meter 56 is divided into three portions 56a, 56b, 56c. The dividing lines between portions 56a, 56b, 56c may be selected so that the three portions cover substantially equal parts of the scale of meter 56. For example, portion 56a may cover 0 to 5 volts; portion 56b may cover 5 to 10 volts and portion 56c may cover 10 to 15 volts, where the entire scale of meter 56 spans from 0 to 15 volts. In reference to FIG. 2, meter 56 responds to the magnitude of the rectified output signal from detector 50 in that needle 60 moves from left to right when the magnitude of the rectified output signal increases.

The gain of detector 50 is adjusted until needle 60 of meter 56 lies at or near the center of the mid-portion 56b in FIG. 2. The gain of detector 50 is then fixed at the level set for future measurements. Meter 56 is now properly calibrated. Hence, when testing of the spark gap ignition assembly is desired, detector 50 may be placed at a same location as that used for calibration and meter 56 is turned on for detecting the rectified output signal of the detector. If needle 60 is again within portion 56b, the condition of the assembly is deemed normal. If, however, needle 60 is in the portion 56a, this indicates that the radio frequency emission from the arc in the assembly is too weak, indicating possible failure in the circuit for applying high voltage to the gap (the transformer or wires connecting the transformer to the spark gap) or that the spark gap is too narrow or has been shorted out. If needle 60 is within portion 56c, this indicates that the pressure of the gas mixture fed to nozzle 12 may be too strong. Hence the reading on meter 56 will yield useful information for diagnosing the condition of the assembly. If needle 60 is within portions 56a or 56c, the likely causes of the defect will then be known so that repair is facilitated.

Digital meter 58 may be calibrated in a similar manner as analog meter 56. Thus, the range or measurement of meter 58 may also be divided into three parts, with the gain of detector 50 set so that when the condition of the assembly is normal, the digital reading of meter 58 will be at or near the center of the normal range.

Instead of dividing the measurement range of meters 56, 58 into three equal parts, it is also possible to select two dividing lines between the three portions 56a, 56b, 56c and the equivalent three ranges in meter 58 by experimental testing to find the optimum dividing lines between the three portions for the purpose of detecting malfunctions.

Figure 3:
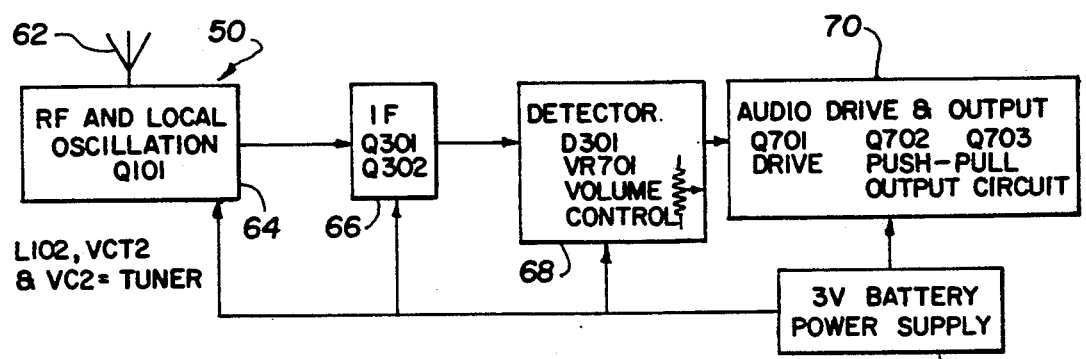
FIG. 3 is a block diagram of an AM radio illustrating the detector portion of the system of FIG. 2.

FIG. 3 is a block diagram of an AM radio illustrating detector 50 of FIG. 2. In the preferred embodiment, detector 50 may be adapted from a Sanyo AM radio Model RP 1390. Sanyo Model RP 1390 is a superheterodyne type receiver in which the incoming modulated RF signals are fed into a mixer for conversion into a fixed, lower carrier frequency called the intermediate frequency. The modulated intermediate frequency signals undergo very high amplification in the intermediate frequency amplifier stages and are then demodulated in a detector. The detector output is then amplified before it is fed to the output. Thus as shown in FIG. 3, detector 50 comprises an antenna 62, a mixer 64, an intermediate frequency amplifier 66, detector 68, audio drive and output circuit 70 and battery 72, connected as shown in FIG. 3.

As shown in FIG. 3, radio wave frequency emissions from the arc together with radio frequency waves from other sources such as radio stations and other noise sources are received by antenna 62 and fed into mixer 64 where the received signals are converted into a fixed, lower carrier frequency (known as the intermediate frequency) signal. The modulated intermediate frequency signal from mixer 64 undergoes very high amplification in amplifier 66 and is subsequently demodulated by detector 68. Audio drive and output circuit 70 is then used to drive an output load (such as a speaker included as part of the radio) in response to the detector output. Battery 72 is used for supplying the necessary DC power to mixer 64, amplifier 66, detector 68 and circuit 70. In the case of Sanyo Model RP 1390, battery 72 may be a three-volt battery power supply which may simply comprise two 1.5 volt batteries.

Since the radio frequency emission from the arc across the spark gap in FIG. 1 is a wide band signal, the emission will have signal components over a broad section of the radio frequency range. It is therefore possible to reduce background noise caused by signals from radio stations and other sources by tuning radio 50 to a frequency where such noise is minimized but where signal components from the radio frequency emissions of the arc are strong enough to be detected. Where detector 50 is a radio, this can be done by turning the tuning dial 52 of FIG. 2 while calibrating the system of FIG. 2 as described above until strong emission signals are detected with a minimum of background noise.

Figure 4:
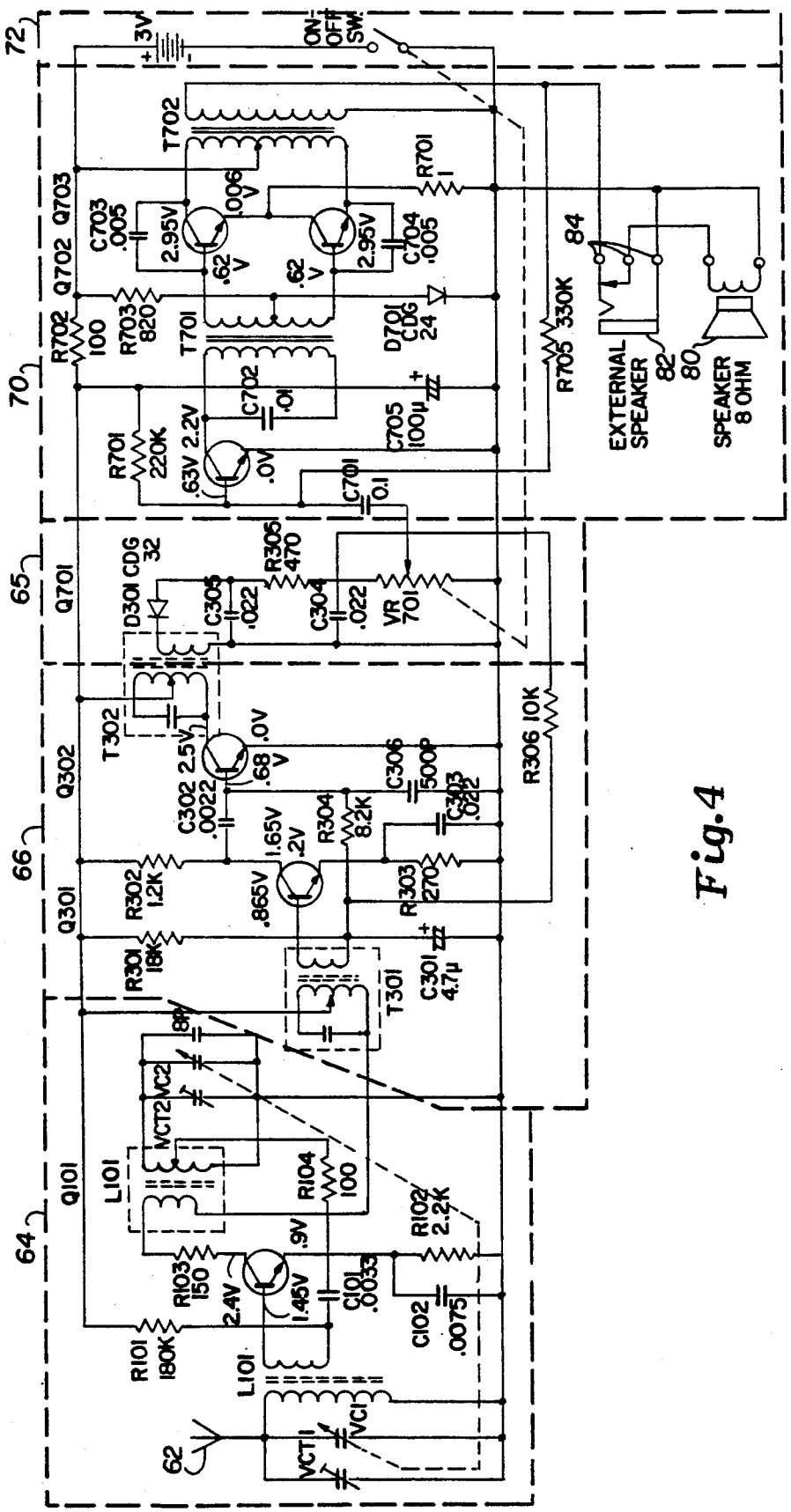
FIG. 4 is a schematic circuit diagram of certain components of the radio of FIG. 3.

FIG. 4 is a schematic circuit diagram illustrating in more detail the components of the detector 50 of FIG. 3, except that battery 72 and the connections between the battery and other components of the radio shown in FIG. 3 have been omitted. As shown in FIG. 4, the audio drive and output circuit 70 includes a connector 84 for an external speaker 82 such as that for an earphone jack. When the radio is not connected to any earphones, the background noise received by antenna 62 will be audible through speaker 80 in the output circuit 70. Thus when the system of FIG. 2 is being calibrated, the tuning dial of the radio may be turned until background music or voice and other noise heard through speaker 80 is minimized while the emission from the arc is clearly audible.

This invention is also based on the recognition that background noise from radio stations and other sources may be greatly reduced or totally eliminated by taking advantage of the fact that the radio frequency emission from the arc will be of much greater magnitude compared to those from radio stations or other sources when detector 50 is placed in the vicinity of the arc. By simply removing the variable capacitances VC 1 and VC 2 in FIG. 4, background noise from radio stations or other sources become inaudible while the radio frequency emission from the arc is still clearly audible. Removing the variable capacitances VC 1 and VC 2 may have the effect of reducing the capacitance of the mixer for storing the signals received from antenna 62. This may have the effect of reducing the audibility of radio station signals and other noise signals. Thus in the preferred embodiment, capacitances VC1 and VC2 are removed and tuning of the radio by rotating the tuning dial is unnecessary.

To convert the Sanyo RP 1390 AM radio into a detector, the connector for earphone jack of the radio is connected to meters 56, 58 as shown in FIG. 2. As in most radios, Sanyo RP 1390 radio has the feature that once the radio is connected to an outside device by means of the earphone connector, the internal speaker 80 of the radio is automatically disabled. In other words, the connector 84 for external speaker 82 in FIG. 4 may be connected to detectors 56, 58 by a common earphone jack cable.

This specification includes as an appendix the service manual of the Sanyo Model RP 1390 AM radio to illustrate in more detail its components.

The above description of circuit implementation and method is merely illustrative thereof and various changes in arrangements or other details of the method and implementation may be within the scope of the appended claims.

I claim:

1. An apparatus for detecting the condition of an ignition assembly in a burner in which a flame is ignited in a fuel medium by means of an electric arc across a spark gap in the assembly, the assembly being substantially inaccessible for the purpose of testing through the use of direct electrical contact without disassembling the burner, said burner having a control system for controlling an operating the burner, said apparatus comprising:

means for detecting the radio frequency emission of the arc at a location separate from that of the burner and of the control system, wherein the detecting means includes a mixer, an antenna and a volume or gain control, said mixer having a capacitance for storing the radio frequency signals received by the antenna, wherein the capacitance is set to a value below the frequency range of signals from radio stations, said detecting means generating an output signal indicative of the strength of the emission;

means for rectifying the output signal; and meter means responsive to the rectified output signal for displaying the strength of the emission to provide visual indication of the condition of the assembly, so that the condition of the assembly can be observed at a distance from the burner without disassembling the burner.

2. The apparatus of claim 1, wherein said rectifying means includes a diode.

3. The apparatus of claim 1, wherein said detecting means includes an AM radio type circuit, wherein the output signal is the audio output from the radio and wherein the meter means displays the strength of the emission as a function of the amplitude of the emission.

4. The apparatus of claim 3, wherein the radio capacitance is set to a frequency at which noise signals from radio stations and other sources are reduced.

5. The apparatus of claim 1, wherein the meter means is analog.

6. The apparatus of claim 1, wherein the meter means is digital.

7. A method for detecting the condition of an ignition assembly in a burner in which a flame is ignited in a fuel medium by means of an electric arc across a spark gap in the assembly, the assembly being substantially inaccessible for the purpose of testing through direct electrical contact without disassembling the burner, said burner having a control system for controlling and operating the burner, said method comprising:

(a) detecting the radio frequency emission of the arc at a location separate from that of the burner and the control system, wherein the detecting means includes a mixer, an antenna and a volume or gain control, said mixer having a capacitance for storing the radio frequency signals received by the antenna, wherein the capacitance is set to a value below the frequency range of signals from radio stations, and generating an output signal indicative of the strength of the emission;

(b) rectifying the output signal; and (c) displaying the strength of the emission as a function of the rectified output signal to provide visual indication of the condition of the assembly, so that the condition of the assembly can be observed at a distance from the burner and the control system without disassembling the burner.

8. The method of claim 7, wherein the strength of the emission is detected by a detection device and displayed on a meter, said method further comprising:

before the detection device and the meter are used for detecting the condition of the assembly, placing the detection device at a selected location separate from the burner and the control system;

(d) recording a range of readings of the rectified output signal on the meter when the condition of the assembly is normal in operation to calibrate the meter; and (e) placing the detecting device at substantially the location, and performing the steps (a) through (c); and (f) comparing the rectified output signal representing the strength of the emission detected at the location to the range of readings of the rectified output signal for normal operation of the assembly to detect any abnormal condition of the assembly.

* * * * *